(12) United States Patent
Simpson et al.

(10) Patent No.: US 10,348,482 B1
(45) Date of Patent: Jul. 9, 2019

(54) APPARATUS, SYSTEM, AND METHOD FOR MITIGATING CROSSTALK AMONG SERDES DEVICES

(71) Applicant: Juniper Networks, Inc., Sunnyvale, CA (US)

(72) Inventors: Mark Simpson, Cupertino, CA (US); Boris Reynov, Cupertino, CA (US); Bipin Dhavale, San Jose, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 15/601,183

(22) Filed: May 22, 2017

(51) Int. Cl.
| | |
|---|---|
| *H04L 7/033* | (2006.01) |
| *H04L 27/34* | (2006.01) |
| *H03L 7/087* | (2006.01) |
| *H04L 7/027* | (2006.01) |
| *H04L 25/49* | (2006.01) |
| *H02M 1/04* | (2006.01) |
| *H04L 25/02* | (2006.01) |
| *H04L 25/03* | (2006.01) |

(52) U.S. Cl.
CPC ........... *H04L 7/033* (2013.01); *H02M 1/045* (2013.01); *H03L 7/087* (2013.01); *H04L 7/027* (2013.01); *H04L 25/0204* (2013.01); *H04L 25/4921* (2013.01); *H04L 27/34* (2013.01); *H04L 2025/03426* (2013.01); *H04L 2203/00* (2013.01)

(58) Field of Classification Search
CPC .............................. H04L 7/033; H04L 7/0311
USPC .................................................. 375/373, 261
See application file for complete search history.

(56) References Cited

U.S. PATENT DOCUMENTS

| | | | |
|---|---|---|---|
| 8,233,477 B1 | 7/2012 | Goergen et al. | |
| 8,502,586 B1 | 8/2013 | Naviasky et al. | |
| 8,532,163 B2* | 9/2013 | Amirichimeh | H03K 5/135 375/219 |
| 2002/0131352 A1* | 9/2002 | Kuribayashi | G11B 7/0053 369/47.17 |
| 2007/0063752 A1* | 3/2007 | Kowalczyk | H03K 3/013 327/202 |
| 2009/0080584 A1* | 3/2009 | Hamano | H03L 7/087 375/371 |
| 2010/0039157 A1* | 2/2010 | Kaeriyama | G06F 1/08 327/292 |
| 2015/0063516 A1* | 3/2015 | Nishiyama | G06F 13/4273 375/373 |

(Continued)

*Primary Examiner* — Kevin M Burd
(74) *Attorney, Agent, or Firm* — FisherBroyles, LLP

(57) ABSTRACT

The disclosed apparatus may include (1) a plurality of SerDes devices that each facilitate transmitting and receiving communications in connection with a network device and (2) at least one phase-adjustment device communicatively coupled to a first SerDes device included in the SerDes devices, wherein the phase-adjustment device mitigates crosstalk among the SerDes devices by (A) receiving at least one reference clock signal, (B) generating at least one phase-adjusted clock signal based at least in part on the reference clock signal such that the phase-adjusted clock signal and the reference clock signal are out of phase with respect to one another, and (C) delivering the phase-adjusted clock signal to the first SerDes device to ensure that the SerDes devices are switching out of phase with respect to one another. Various other apparatuses, systems and methods are also disclosed.

16 Claims, 5 Drawing Sheets

(56) References Cited

U.S. PATENT DOCUMENTS

2015/0085914 A1* 3/2015 Kizer .................. H04L 27/06
375/233
2015/0358005 A1* 12/2015 Chen .................. H03K 5/003
375/233

* cited by examiner

APPARATUS, SYSTEM, AND METHOD FOR MITIGATING CROSSTALK AMONG SERDES DEVICES

BACKGROUND

As switching speeds increase in SerDes devices, so too may the amount of crosstalk introduced by these SerDes devices into other circuit components. For example, an Application-Specific Integrated Circuit (ASIC) may include multiple SerDes transmitters that transmit communications to other devices. These SerDes transmitters may switch back and forth at a certain speed to modulate the transmissions.

Continuing with this example, the ASIC may also include multiple SerDes receivers that receive communications from other devices. Unfortunately, these SerDes receivers may be adversely affected by crosstalk introduced by the SerDes transmitters. For example, the switching of the SerDes transmitters may generate crosstalk interference that adversely affects the functionality of the SerDes receivers within the ASIC. The adverse effects of such crosstalk interference may worsen with higher switching speeds and/or when the SerDes transmitters are switching simultaneously and/or in phase with one another.

The instant disclosure, therefore, identifies and addresses a need for additional and improved apparatuses, systems, and methods for mitigating crosstalk among SerDes devices, especially as switching speeds continue to increase.

SUMMARY

As will be described in greater detail below, the instant disclosure generally relates to apparatuses, systems and methods for mitigating crosstalk among SerDes devices. In one example, an apparatus for accomplishing such a task may include (1) a plurality of SerDes devices that each facilitate transmitting and receiving communications in connection with a network device and (2) at least one phase-adjustment device communicatively coupled to a first SerDes device included in the SerDes devices, wherein the phase-adjustment device mitigates crosstalk among the SerDes devices by (A) receiving at least one reference clock signal, (B) generating at least one phase-adjusted clock signal based at least in part on the reference clock signal such that the phase-adjusted clock signal and the reference clock signal are out of phase with respect to one another, and (C) delivering the phase-adjusted clock signal to the first SerDes device to ensure that the SerDes devices are switching out of phase with respect to one another.

Similarly, an ASIC incorporating the above-described apparatus may include (1) a plurality of SerDes devices that each facilitate transmitting and receiving communications in connection with a network device and (2) at least one phase-adjustment device communicatively coupled to a first SerDes device included in the SerDes devices, wherein the phase-adjustment device mitigates crosstalk among the SerDes devices by (A) receiving at least one reference clock signal, (B) generating at least one phase-adjusted clock signal based at least in part on the reference clock signal such that the phase-adjusted clock signal and the reference clock signal are out of phase with respect to one another, and (C) delivering the phase-adjusted clock signal to the first SerDes device to ensure that the SerDes devices are switching out of phase with respect to one another.

A corresponding method may include (1) coupling, within an ASIC, a first phase-adjustment device between a phase-locked loop and a first SerDes device that implements a pulse amplitude modulation (2) coupling, within the ASIC, a second phase-adjustment device between the phase-locked loop and a second SerDes device that implements the pulse amplitude modulation, (3) receiving, at the first and second phase-adjustment devices, a reference clock signal from the phase-locked loop, (4) generating, based at least in part on the reference clock signal a first phase-adjusted clock signal at the first phase-adjustment device and a second phase-adjusted clock signal at the second phase-adjustment device such that the first and second phase-adjusted clock signals are out of phase with respect to one another, and then (5) delivering the first phase-adjusted clock signal to the first SerDes device and the second phase-adjusted clock signal to the second SerDes device to ensure that the first and second SerDes devices are switching out of phase with respect to one another.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
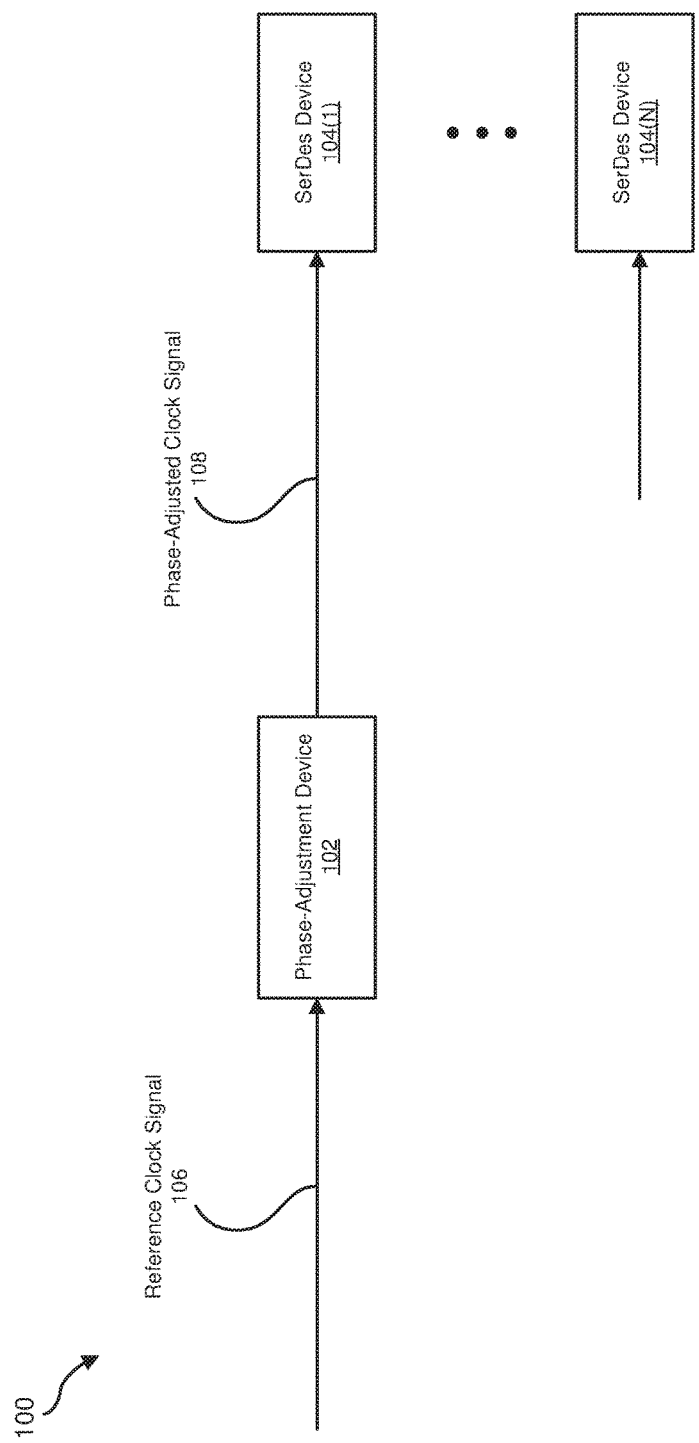
FIG. 1 is a block diagram of an exemplary apparatus for mitigating crosstalk among SerDes devices.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for mitigating crosstalk among SerDes devices. As will be explained in greater detail below, embodiments of the instant disclosure may involve and/or provide phase-adjustment devices that delay clock signals that are fed to certain SerDes devices. By delaying such clock signals, these phase-adjustment devices may ensure that the transmitters within the SerDes devices are switching out of phase. Moreover, by ensuring that the SerDes transmitters are switching out of phase, these phase-adjustment devices may effectively mitigate and/or reduce the amount of crosstalk interference introduced by the SerDes transmitters.

As a result, receivers within the SerDes devices may function better, and their ground bounce and Bit Error Rates (BERs) may improve. In addition, the SerDes devices may still function properly even as the routing channel lengths increase on corresponding circuit boards.

FIG. 1 shows an exemplary apparatus 100 that facilitates mitigating crosstalk among SerDes devices. As illustrated in FIG. 1, apparatus 100 may include and/or represent a phase-adjustment device 102 and SerDes devices 104(1)-(N). In this example, phase-adjustment device 102 may receive a reference clock signal 106 and then generate a phase-adjusted clock signal 108 based at least in part on reference clock signal 106. Phase-adjustment device 102 may deliver phase-adjusted clock signal 108 to SerDes device 104(1).

Continuing with this example, SerDes device 104(N) may receive a clock signal similar to the one received by SerDes device 104(1). These clock signals may enable SerDes devices 104(1) and 104(N) to transmit communications from one network device to another and/or modulate such communications. Such network devices include, without limitation, routers (such as customer edge routers, provider edge routers, hub routers, spoke routers, autonomous system boundary routers, and/or area border routers), switches, hubs, modems, bridges, repeaters, gateways, multiplexers, network adapters, network interfaces, servers, portions of one or more of the same, combinations or variations of one or more of the same, and/or any other suitable network devices.

In one example, SerDes device 104(N) may receive a clock signal that is phase-adjusted by another phase-adjustment device (not necessarily illustrated in FIG. 1). In another example, SerDes device 104(N) may receive reference clock signal 106.

In either case, phase-adjusted clock signal 108 and the clock signal received by SerDes device 104(N) may be out of phase with respect to one another. As a result, the transmitters within SerDes devices 104(1) and 104(N) may switch back and forth at different times. For example, the transmitter within SerDes device 104(1) may switch back and forth at different times than the transmitter within SerDes device 104(N) and vice versa. Accordingly, by delivering phase-adjusted clock signal 108 to the transmitter within SerDes device 104(1) in this way, phase-adjustment device 102 may effectively ensure that the transmitters within SerDes devices 104(1) and 104(N) are switching out of phase with respect to one another.

The term "out of phase," as used herein, generally refers to a condition, occurrence, and/or phenomenon in which signals of the same frequency switch from one state (e.g., high) to another state (e.g., low) at different times than one another. The term "in phase," as used herein, generally refers to a condition, occurrence, and/or phenomenon in which signals of the same frequency switch from one state (e.g., high) to another state (e.g., low) at the same time as one another.

In one example, a first clock signal and a second clock signal may both have the same frequency (e.g., 1 gigahertz) and the same period (e.g., 1 nanosecond). However, the first and second clock signals may be out of phase with one another (by, e.g., 45 degrees, 90 degrees, 180 degrees, etc.).

As a specific example, two clock signals may both have a frequency of 1 gigahertz but be 180 degrees out of phase. In this example, the first clock signal may switch from high to low (or from a logic "1" to a logic "0") at time $T_0=0$ picoseconds. In this example, the first clock signal may switch back from low to high (or from a logic "0" to a logic "1") at time $T_2=1,000$ picoseconds. In contrast, the second clock signal may switch from high to low (or from a logic "1" to a logic "0") at time $T_1=500$ picoseconds. In this example, the first clock signal may switch back from low to high (or from a logic "0" to a logic "1") at time $T_3=1,500$ picoseconds.

In one example, reference clock signal 106 and/or phase-adjusted clock signal 108 may include and/or represent a digital signal that propagates between high and low levels. In another example, reference clock signal 106 and phase-adjusted clock signal 108 may include and/or represent an analog sine wave that oscillates between maximum and minimum peaks.

Figure 2:
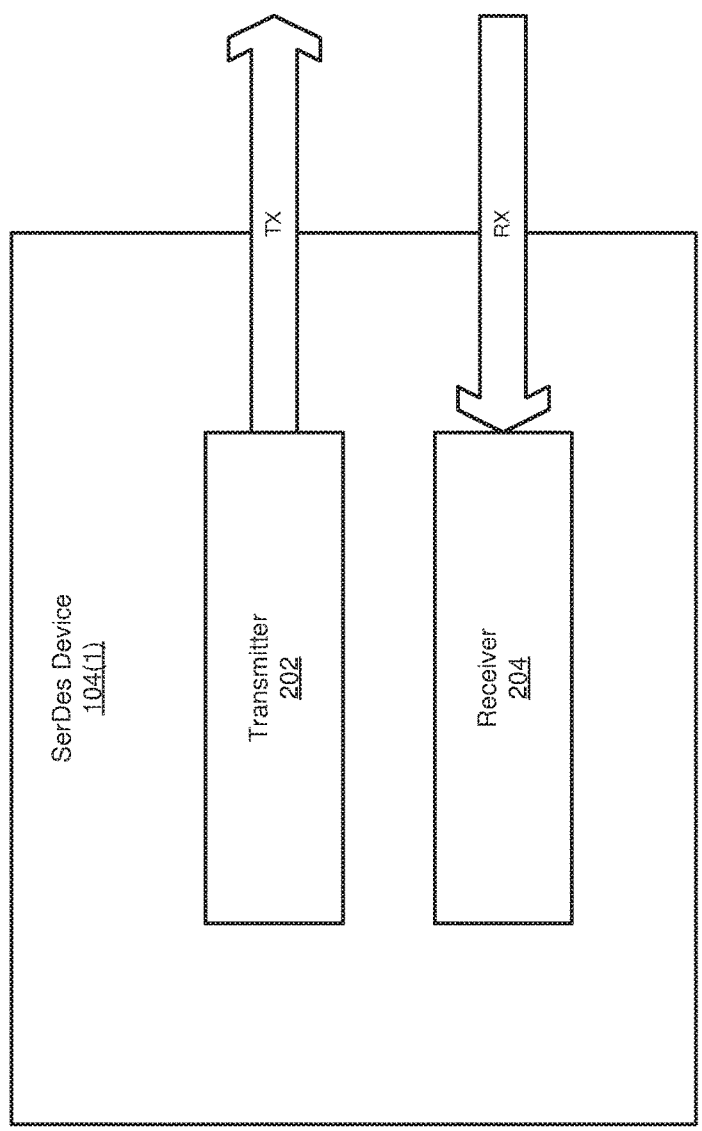
FIG. 2 is a block diagram of an exemplary SerDes device.

SerDes devices 104(1)-(N) each generally represent any serializer/deserializer that converts data between serial and parallel formats and/or interfaces. In some examples, SerDes devices 104(1)-(N) may each include various circuits and/or components. As illustrated in FIG. 2, SerDes device 104(1) may include a transmitter 202 that transmits data and a receiver 204 that receives data. SerDes devices 104(1)-(N) may implement any type or form of pulse amplitude modulation. For example, SerDes device 104(1) may implement 4-level Pulse Amplitude Modulation (PAM-4). In this example, transmitter 202 may transmit serial data communications via PAM-4, and receiver 204 may receive serial data communications via PAM-4. Additional examples of such pulse amplitude modulation include, without limitation, 6-level Pulse Amplitude Modulation (PAM-6), 8-level Pulse Amplitude Modulation (PAM-8), variations of one or more of the same, and/or any other suitable pulse amplitude modulation.

In addition, transmitter 202 and receiver 204 may operate on different clock domains with respect to one another. For example, transmitter 202 may operate on one clock domain, and receiver 204 may operate on another clock domain. Accordingly, the clock signals delivered to SerDes devices 104(1)-(N) may fail to control and/or influence the switching of the receivers within SerDes devices 104(1)-(N).

In some examples, SerDes devices 104(1)-(N) may each serialize parallel data for transmission from one network device to another. Similarly, SerDes devices 104(1)-(N) may, at one network device, receive serial data from another network device and then parallelize the data for use and/or consumption.

Phase-adjustment device 102 generally represents any circuit and/or component that modifies and/or changes the phase of an input clock signal. In one example, phase-adjustment device 102 may delay the clock signal for a certain amount of time, thereby modifying and/or changing the phase of the input clock signal. For example, phase-adjustment device 102 may receive reference clock signal 106 and then generate phase-adjusted clock signal 108 by delaying reference clock signal 106. In this example, reference clock signal 106 may represent the input being fed into phase-adjustment device 102, and phase-adjusted clock signal 108 may represent the output of phase-adjustment device 102 being fed into SerDes device 104(1).

Figure 3:
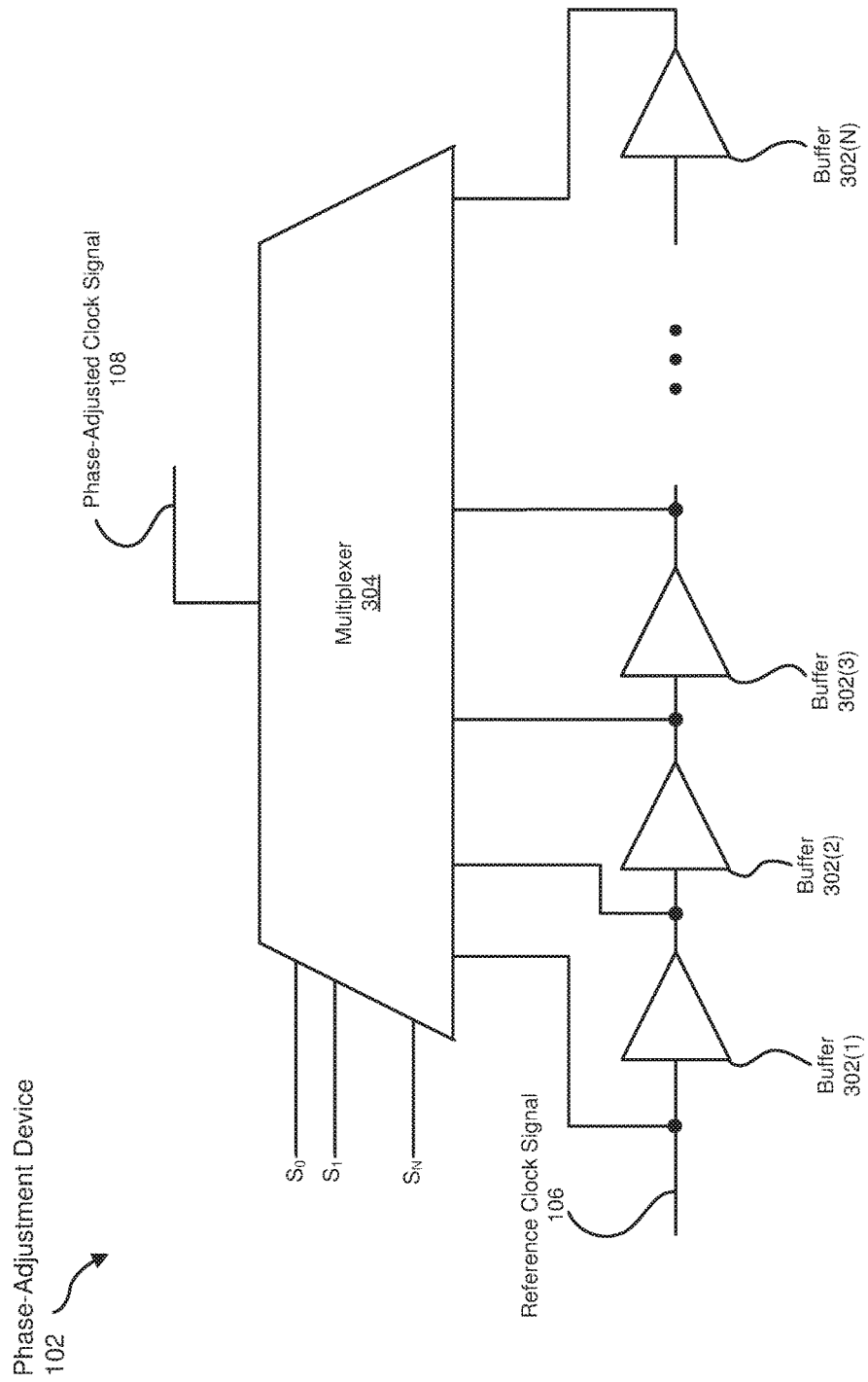
FIG. 3 is a block diagram of an exemplary phase-adjustment device.

In some examples, phase-adjustment device 102 may include various circuits and/or components. As illustrated in FIG. 3, phase-adjustment device 102 may include a programmable multiplexer 304 and a set of buffers 302(1)-(N). In this example, multiplexer 304 may effectively select one of several input signals. The selected signal may represent and/or become phase-adjusted clock signal 108. Multiplexer 304 may thus send and/or forward the selected signal to SerDes 104(1) (not illustrated in FIG. 3) as phase-adjusted clock signal 108. Multiplexer 304 may also control the number of buffers through which reference clock signal 106 passes to form phase-adjusted clock signal 108. The multiplexer's control of the number of buffers may be based at least in part on the configuration of select lines (e.g., $S_0$-$S_N$).

As illustrated in FIG. 3, the input to multiplexer 304 may include and/or represent any of a variety of signals. For example, the input may include and/or represent reference clock signal 106. In another example, the input may include and/or represent the signal resulting from reference clock signal 106 having passed through buffer 302(1). In a further example, the input may include and/or represent the signal resulting from reference clock signal 106 having passed through buffer 302(1) and buffer 302(2). Alternatively, the input may include and/or represent the signal resulting from reference clock signal 106 having passed through buffer 302(1), buffer 302(2), and buffer 302(3). The input may also include and/or represent the signal resulting from reference clock signal 106 having passed through all of buffers 302(1)-(N).

Buffers 302(1)-(N) each generally represent any circuit and/or component that shifts the phase of and/or delays an input clock signal. The number of buffers 302(1)-(N) through which reference clock signal 106 passes to form phase-adjusted clock signal 108 may be programmed by select lines (e.g., $S_0$-$S_N$). For example, programmable multiplexer 304 may select the number of buffers through which reference clock signal 106 passes to for phase-adjusted clock signal 108 based at least in part on which select lines are pulled high and/or low by a control interface (not illustrated in FIG. 3). In this example, as the number of buffers increases, so too may the amount of delay and/or phase between reference clock signal 106 and phase-adjusted clock signal 108. Although the example illustrated in FIG. 3 relies on buffers to delay and/or shift the phase of reference clock signal 106 to form phase-adjusted clock signal 108, phase-adjustment device 102 may alternatively implement and/or rely on various other types of delay elements to delay and/or shift the phase of reference clock signal 106 to form phase-adjusted clock signal 108.

In some examples, the optimal amount of delay and/or phase between reference clock signal 106 and phase-adjusted clock signal 108 may depend on a variety of factors. In one example the amount of delay and/or phase needed to improve and/or optimize the performance of SerDes devices 104(1)-(N) may depend on the physical layout of SerDes devices 104(1)-(N) within an ASIC. For example, as the distance between SerDes devices 104(1)-(N) changes within an ASIC, the optimal amount of delay and/or phase between reference clock signal 106 and phase-adjusted clock signal 108 may also change (whether directly proportionately or inversely proportionately).

The optimal amount of delay and/or phase may be determined, calculated, and/or deduced in a variety of ways. In one example, a user and/or a control interface may sweep, try, and/or test the various combinations of high-low signals across the select lines (e.g., $S_0$-$S_N$) of multiplexer 304 in FIG. 3. In this example, the user and/or a signal-monitoring tool may examine and/or analyze eye patterns and/or diagrams that result from probing the incoming signals on the receivers within SerDes 104(1)-(N) as the various combinations of high-low signals are swept, tried, and/or tested. These eye patterns and/or diagrams may represent and/or indicate the level of crosstalk and/or interference that the receivers are experiencing. Accordingly, these eye patterns and/or diagrams may be used to identify which select lines to pull high and/or which select lines to pull low to achieve the optimal amount of delay and/or phase between reference clock signal 106 and phase-adjusted clock signal 108, which corresponds to least amount of crosstalk and/or interference.

Figure 4:
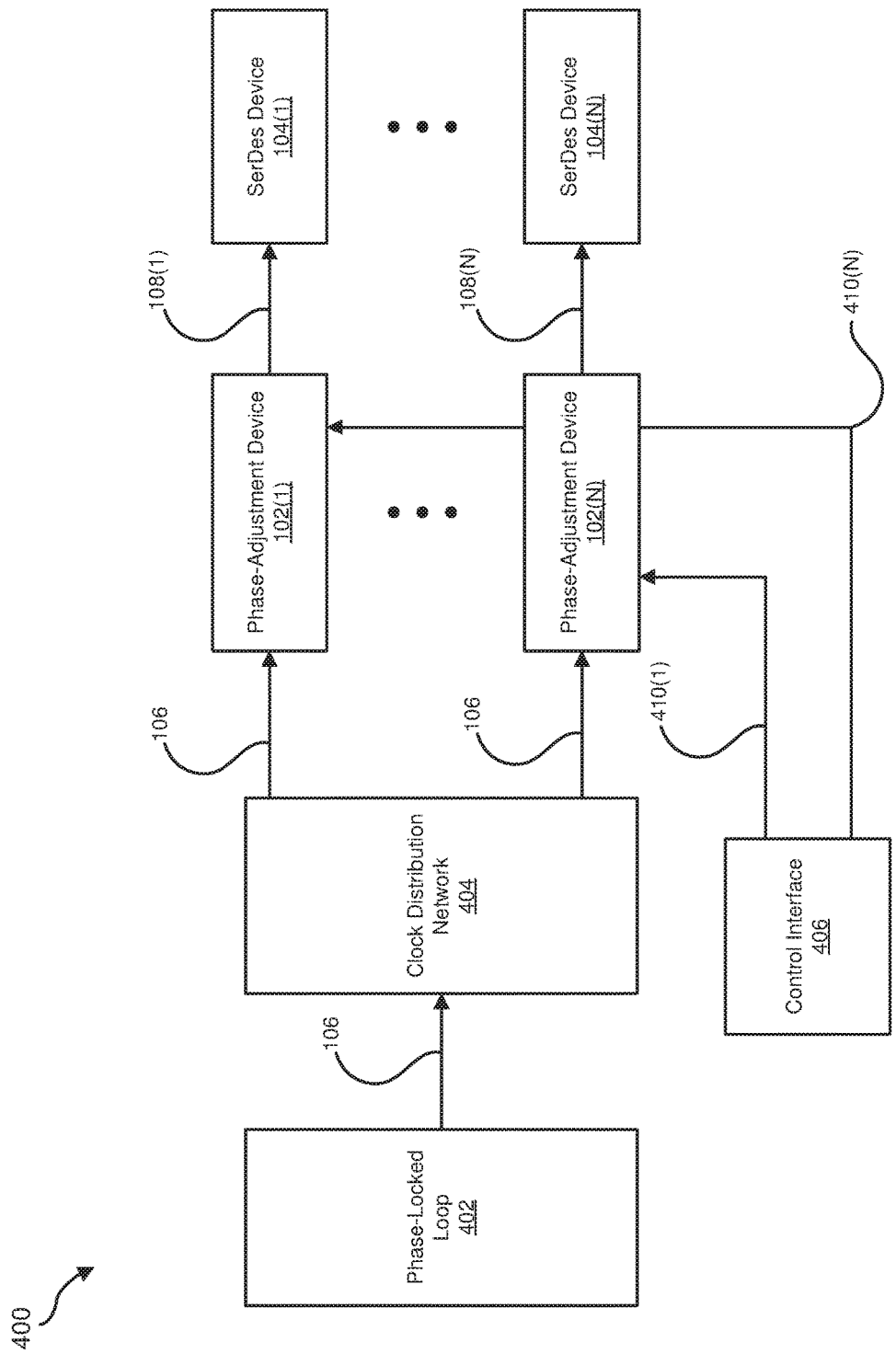
FIG. 4 is a block diagram of an additional exemplary apparatus for mitigating crosstalk among SerDes devices.

FIG. 4 shows an exemplary apparatus 400 that facilitates mitigating crosstalk among SerDes devices. As illustrated in FIG. 4, apparatus 400 may include phase-adjustment devices 102(1)-(N) that are communicatively connected and/or coupled to SerDes devices 104(1)-(N), respectively. In this example, apparatus 400 may also include a phase-locked loop 402 and a clock distribution network 404 that is communicatively connected and/or coupled to each of phase-adjustment devices 102(1)-(N). In addition, apparatus 400 may include a control interface 406 that controls the logic level (e.g., high or low) of select buses 410(1)-(N) on phase-adjustment devices 102(1)-(N).

In some examples, each of select buses 410(1)-(N) may include a plurality of select lines (similar to $S_0$-$S_N$ in FIG. 3). In one example, control interface 406 may program at least some of select buses 410(1)-(N) to different settings with respect to one another. For example, control interface 406 may program the select lines included in select bus 410(1) to one setting and the select lines included in select bus 410(N) to another setting.

In one example, phase-locked loop 402 may generate and/or provide reference clock signal 106. In this example, phase-locked loop 402 may feed and/or deliver reference clock signal 106 to clock distribution network 404. In turn, clock distribution network 404 may feed and/or deliver reference clock signal 106 to each of phase-adjustment devices 102(1)-(N).

In some examples, each of phase-adjustment devices 102(1)-(N) may apply a delay to reference clock signal 106, thereby creating phase-adjusted clock signals 108(1)-(N), respectively. For example, phase-adjustment devices 102(1)-(N) may each receive reference clock signal 106. In this example, phase-adjustment device 102(1) may apply a certain delay and/or phase-shift to reference clock signal 106 to create phase-adjusted clock signal 108(1). In addition, phase-adjustment device 102(N) may apply a certain delay and/or phase-shift to reference clock signal 106 to create phase-adjusted clock signal 108(N).

In such examples, some or all of phase-adjusted clock signals 108(1)-(N) may be out of phase with one another. In other examples, some but not all of phase-adjustment devices 102(1)-(N) may apply a delay to reference clock signal 106 such that at least one of phase-adjusted clock signal 108(1)-(N) is in phase with reference clock signal 106. The determination as to which clock signals to delay and/or how much phase to shift on such clock signals may depend on the corresponding eye patterns and/or diagrams (as discussed above in connection with the optimal amount of delay and/or phase).

In some examples, phase-adjustment devices 102(1)-(N) may mitigate crosstalk among SerDes devices 104(1)-(N). For example, phase-adjustment devices 102(1)-(N) may feed and/or deliver phase-adjusted clock signals 108(1)-(N) to SerDes devices 104(1)-(N). In this example, some or all of phase-adjusted clock signals 108(1)-(N) may be out of phase with respect to one another. Accordingly, by feeding and/or delivering such phase-adjusted clock signals to SerDes devices 104(1)-(N) in this way, phase-adjustment devices 102(1)-(N) may prevent the transmitters within SerDes devices 104(1)-(N) from simultaneously switching and/or transmitting PAM-4 communications in phase with one another. As a result, phase-adjustment devices 102(1)-(N) may protect the receivers within SerDes devices 104(1)-(N) from crosstalk that results from in-phase PAM-4 communications.

In some examples, SerDes devices 104(1)-(N) may be physically arranged adjacent to one another within an ASIC of a network device (such as a router or switch). Additionally or alternatively, SerDes devices 104(1)-(N) may be physically aligned in parallel with one another within an ASIC of a network device.

Figure 5:
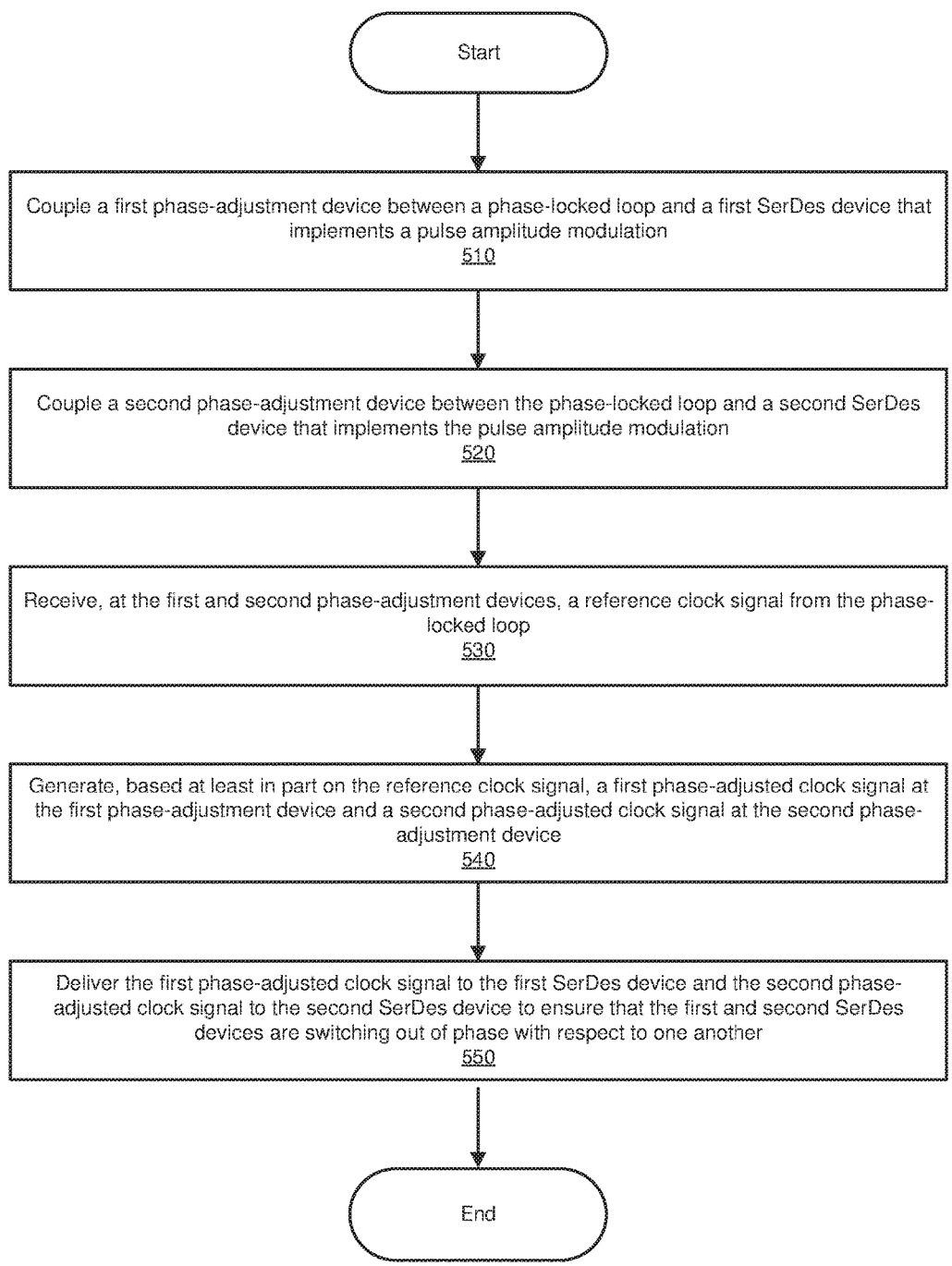
FIG. 5 is a flow diagram of an exemplary method for mitigating crosstalk among SerDes devices.

FIG. 5 is a flow diagram of an exemplary method 500 for mitigating crosstalk among SerDes devices. Method 500 may include the step of communicatively coupling a first phase-adjustment device between a phase-locked loop and a first SerDes device that implements a pulse amplitude modulation (510). This coupling step may be performed in a variety of ways. For example, a telecommunications equipment manufacturer may manually and/or robotically couple phase-adjustment device 102(1) between phase-locked loop 402 and SerDes device 104(1). In this example, phase-adjustment device 102(1), phase-locked loop 402, and/or SerDes device 104(1) may represent portions of and/or be included in an ASIC on a network device. The telecommunications equipment manufacturer may perform this coupling step during and/or as a part of the ASIC manufacturing process.

Returning to FIG. 5, method 500 may also include the step of communicatively coupling a second phase-adjustment device between the phase-locked loop and a second SerDes device that implements the pulse amplitude modulation (520). This coupling step may be performed in a variety of ways. For example, a telecommunications equipment manufacturer may manually and/or robotically couple phase-adjustment device 102(N) between phase-locked loop 402 and SerDes device 104(N). In this example, phase-adjustment device 102(N), phase-locked loop 402, and/or SerDes device 104(1) may represent portions of and/or be included in an ASIC on a network device. The telecommunications equipment manufacturer may perform this coupling step during and/or as a part of the ASIC manufacturing process.

Returning to FIG. 5, method 500 may also include the step of receiving, at the first and second phase-adjustment devices, a reference clock signal from the phase-locked loop (530). This receiving step may be performed in a variety of ways. For example, phase-adjustment devices 102(1) and 102(N) may each receive reference clock signal 106 from phase-locked loop 402. In one example, reference clock signal 106 may arrive at phase-adjustment devices 102(1) and 102(N) via clock distribution network 404.

Returning to FIG. 5, method 500 may also include the step of generating a first phase-adjusted clock signal at the first phase-adjustment device and a second phase-adjusted clock signal at the second phase-adjustment device based at least in part on the reference clock signal (540). This generating step may be performed in a variety of ways. For example, phase-adjustment device 102(1) and/or phase-adjustment device 102(N) may delay reference clock signal 106 to form phase-adjusted clock signals 108(1) and 108(N), respectively. In one example, phase-adjustment device 102(1) and/or phase-adjustment device 102(N) may achieve this delay by passing reference clock signal 106 through one or more buffers. As a result phase-adjusted clock signals 108(1) and 108(N) may be out of phase with one another.

Returning to FIG. 5, method 500 may also include the step of delivering the first phase-adjusted clock signal to the first SerDes device and the second phase-adjusted clock signal to the second SerDes device to ensure that the first and second SerDes devices are switching out of phase with respect to one another (550). This delivering step may be performed in a variety of ways. For example, phase-adjustment device 102(1) and phase-adjustment device 102(N) may feed, forward, and/or send phase-adjusted clock signals 108(1) and 108(N) to SerDes devices 104(1) and 104(N), respectively. By doing so, phase-adjustment device 102(1) and phase-adjustment device 102(N) may ensure that SerDes devices 104(1) and 104(N) are switching out of phase with respect to one another.

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
 a plurality of SerDes devices that each facilitate transmitting and receiving communications in connection with a network device, wherein each of the SerDes devices comprises:
  a transmitter that operates in a clock domain; and
  a receiver that operates in a different clock domain than the transmitter;
 at least one phase-adjustment device communicatively coupled to a first SerDes device included in the SerDes devices, wherein:
  the phase-adjustment device mitigates crosstalk among the SerDes devices by:
   receiving at least one reference clock signal;
   generating at least one phase-adjusted clock signal based at least in part on the reference clock signal such that the phase-adjusted clock signal and the reference clock signal are out of phase with respect to one another; and delivering the phase-adjusted clock signal to the first SerDes device to ensure that the SerDes devices are switching out of phase with respect to one another;

the phase-adjustment device comprises:
one or more buffers that facilitate delaying the reference clock signal to form the phase-adjusted clock signal; and
a programmable multiplexer that controls, based at least in part on a plurality of select lines, the number of buffers through which the reference clock signal passes to form the phase-adjusted clock signal;

at least one control interface that sweeps a plurality of different combinations of high-low signals across the select lines by testing the plurality of different combinations of high-low signals, wherein:
each combination of high-low signals comprises:
a first select line included in the select lines that is pulled to a logic high level or a logic low level;
a second select line included in the select lines that is pulled to the logic high level or the logic low level;
each combination of high-low signals is different from one another;

a processor that:
probes an incoming signal on the receiver included in the first SerDes device;
facilitates determining an optimal amount of delay between the reference clock signal and the phase-adjusted clock signal by analyzing an eye pattern that:
results from probing the incoming signal on the receiver included in the first SerDes device;
represents a level of crosstalk experienced by the receiver included in the first SerDes device during the sweep, the optimal amount of delay between the reference clock signal and the phase-adjusted clock signal being dependent upon at least one distance between the plurality of SerDes devices;
facilitates identifying, by analyzing the eye pattern during the sweep, a combination of high-low signals on the select lines that achieves the optimal amount of delay between the reference clock signal and the phase-adjusted clock signal; and
wherein the control interface programs the programmable multiplexer by setting the select lines with the identified combination of high-low signals to delay the reference clock signal by the optimal amount of delay such that the reference clock signal and the phase-adjusted clock signal are out of phase with respect to one another by the optimal amount of delay.

2. The apparatus of claim 1, wherein each of the SerDes devices implements 4-level Pulse Amplitude Modulation (PAM-4).

3. The apparatus of claim 2, wherein:
each transmitter transmits communications via PAM-4; and
each receiver receives communications via PAM-4.

4. The apparatus of claim 3, wherein the phase-adjustment device mitigates crosstalk among the SerDes devices by:
preventing the transmitters of the SerDes devices from simultaneously transmitting PAM-4 communications in phase with one another; and
protecting the receivers of the SerDes devices from crosstalk that results from in-phase PAM-4 communications.

5. The apparatus of claim 3, wherein the phase-adjustment device:
is communicatively coupled to the transmitter of the first SerDes device; and
delivers the phase-adjusted clock signal to the transmitter of the first SerDes device to ensure that the transmitters of the SerDes devices are switching out of phase with respect to one another.

6. The apparatus of claim 1, wherein the phase-adjustment device comprises a plurality of phase-adjustment devices coupled to the SerDes devices; and
further comprising a phase-locked loop that:
generates the reference clock signal; and
delivers the reference clock signal to each of the phase-adjustment devices.

7. The apparatus of claim 6, wherein:
the SerDes devices comprise a second SerDes device; and
the phase-adjustment devices comprise:
a first phase-adjustment device that is coupled to the first SerDes device; and
a second phase-adjustment device that is coupled to the second SerDes device, wherein the second phase-adjustment device mitigates crosstalk among the SerDes devices in conjunction with the first phase-adjustment device by:
receiving the reference clock signal;
generating an additional phase-adjusted clock signal based at least in part on the reference clock signal such that the phase-adjusted clock signal and the additional phase-adjusted clock signal are out of phase with respect to one another; and
delivering the additional phase-adjusted clock signal to the second SerDes device to ensure that the SerDes devices are switching out of phase with respect to one another.

8. The apparatus of claim 1, wherein the SerDes devices are physically arranged adjacent to one another within an Application-Specific Integrated Circuit (ASIC) of the network device.

9. An Application-Specific Integrated Circuit (ASIC) comprising:
a plurality of SerDes devices that each facilitate transmitting and receiving communications in connection with a network device, wherein each of the SerDes devices comprises:
a transmitter that operates in a clock domain; and
a receiver that operates in a different clock domain than the transmitter;
at least one phase-adjustment device communicatively coupled to a first SerDes device included in the SerDes devices, wherein:
the phase-adjustment device mitigates crosstalk among the SerDes devices by:
receiving at least one reference clock signal;
generating at least one phase-adjusted clock signal based at least in part on the reference clock signal such that the phase-adjusted clock signal and the reference clock signal are out of phase with respect to one another; and
delivering the phase-adjusted clock signal to the first SerDes device to ensure that the SerDes devices are switching out of phase with respect to one another;
the phase-adjustment device comprises:
one or more buffers that facilitate delaying the reference clock signal to form the phase-adjusted clock signal; and a programmable multiplexer that controls, based at least in part on a plurality of select lines, the number of buffers through which the reference clock signal passes to form the phase-adjusted clock signal;
at least one control interface that sweeps a plurality of different combinations of high-low signals across the select lines by testing the plurality of different combinations of high-low signals, wherein:
each combination of high-low signals comprises:
a first select line included in the select lines that is pulled to a logic high level or a logic low level;
a second select line included in the select lines that is pulled to the logic high level or the logic low level;
each combination of high-low signals is different from one another;
a processor that:
probes an incoming signal on the receiver included in the first SerDes device;
facilitates determining an optimal amount of delay between the reference clock signal and the phase-adjusted clock signal by analyzing an eye pattern that:
results from probing the incoming signal on the receiver included in the first SerDes device;
represents a level of crosstalk experienced by the receiver included in the first SerDes device during the sweep, the optimal amount of delay between the reference clock signal and the phase-adjusted clock signal being dependent upon at least one distance between the plurality of SerDes devices;
facilitates identifying, by analyzing the eye pattern during the sweep, a combination of high-low signals on the select lines that achieves the optimal amount of delay between the reference clock signal and the phase-adjusted clock signal; and
wherein the control interface programs the programmable multiplexer by setting the select lines with the identified combination of high-low signals to delay the reference clock signal by the optimal amount of delay such that the reference clock signal and the phase-adjusted clock signal are out of phase with respect to one another by the optimal amount of delay.

10. The ASIC of claim 9, wherein each of the SerDes devices implements 4-level Pulse Amplitude Modulation (PAM-4).

11. The ASIC of claim 10, wherein:
each transmitter transmits communications via PAM-4; and
each receiver receives communications via PAM-4.

12. The ASIC of claim 11, wherein the phase-adjustment device mitigates crosstalk among the SerDes devices by:
preventing the transmitters of the SerDes devices from simultaneously transmitting PAM-4 communications in phase with one another; and
protecting the receivers of the SerDes devices from crosstalk that results from in-phase PAM-4 communications.

13. The ASIC of claim 9, wherein the phase-adjustment device comprises a plurality of phase-adjustment devices coupled to the SerDes devices; and
further comprising a phase-locked loop that:
generates the reference clock signal; and
delivers the reference clock signal to each of the phase-adjustment devices.

14. The ASIC of claim 13, wherein:
the SerDes devices comprise a second SerDes device; and
the phase-adjustment devices comprise:
a first phase-adjustment device that is coupled to the first SerDes device; and
a second phase-adjustment device that is coupled to the second SerDes device, wherein the second phase-adjustment device mitigates crosstalk among the SerDes devices in conjunction with the first phase-adjustment device by:
receiving the reference clock signal;
generating an additional phase-adjusted clock signal based at least in part on the reference clock signal such that the phase-adjusted clock signal and the additional phase-adjusted clock signal are out of phase with respect to one another; and
delivering the additional phase-adjusted clock signal to the second SerDes device to ensure that the SerDes devices are switching out of phase with respect to one another.

15. The ASIC of claim 9, wherein the SerDes devices are physically arranged adjacent to one another within the ASIC.

16. A method comprising:
coupling, within an Application-Specific Integrated Circuit (ASIC), a phase-adjustment device between a phase-locked loop and a first SerDes device included in a plurality of SerDes devices, wherein:
each of the SerDes devices comprises:
a transmitter that operates in a clock domain; and
a receiver that operates in a different clock domain than the transmitter; and
the phase-adjustment device comprises:
a set of buffers that facilitate delaying a reference clock signal to form a phase-adjusted clock signal for the first SerDes device; and
a programmable multiplexer that controls, based at least in part a plurality of select lines, the number of buffers through which the reference clock signal passes to form the phase-adjusted clock signal;
receiving, at the phase-adjustment device, the reference clock signal from the phase-locked loop;
sweeping a plurality of different combinations of high-low signals across the select lines of the programmable multiplexer that controls the number of buffers through which the reference clock signal passes to form the phase-adjusted clock signal, wherein:
each combination of high-low signals comprises:
a first select line included in the select lines that is pulled to a logic high level or a logic low level;
a second select line included in the select lines that is pulled to the logic high level or the logic low level;
each combination of high-low signals is different from one another;
probing an incoming signal on the receiver included in the first SerDes device;
determining an optimal amount of delay between the reference clock signal and the phase-adjusted clock signal by analyzing an eye pattern that:
results from probing the incoming signal on the receiver included in the first SerDes device;
represents a level of crosstalk experienced by the receiver included in the first SerDes device during the sweep, the optimal amount of delay between the reference clock signal and the phase-adjusted clock signal being dependent upon at least one distance between the plurality of SerDes devices;

identifying, by analyzing the eye pattern during the sweep, a combination of high-low signals on the select lines that achieves the optimal amount of delay between the reference clock signal and the phase-adjusted clock signal;

programming the programmable multiplexer by setting the select lines with the identified combination of high-low signals to delay the reference clock signal by the optimal amount of delay;

generating, based at least in part on the select lines of the programmable multiplexer having been set with the identified combination of high-low signals, the phase-adjusted clock signal at the phase-adjustment device such that the reference clock signal and the phase-adjusted clock signal are out of phase with respect to one another by the optimal amount of delay; and delivering the phase-adjusted clock signal to the first SerDes device to ensure that the plurality of SerDes devices are switching out of phase with respect to one another by the optimal amount of delay.

* * * * *